(12) United States Patent
Shin et al.

(10) Patent No.: US 9,397,050 B2
(45) Date of Patent: Jul. 19, 2016

(54) SEMICONDUCTOR DEVICE AND METHOD OF FORMING PRE-MOLDED SEMICONDUCTOR DIE HAVING BUMPS EMBEDDED IN ENCAPSULANT

(75) Inventors: HanGil Shin, Gyeonggi-do (KR); HeeJo Chi, Kyoungki-do (KR); NamJu Cho, Gyeonggi-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 815 days.

(21) Appl. No.: 12/551,270

(22) Filed: Aug. 31, 2009

(65) Prior Publication Data

US 2011/0049695 A1 Mar. 3, 2011

(51) Int. Cl.
*H01L 21/00* (2006.01)
*H01L 23/538* (2006.01)
(Continued)

(52) U.S. Cl.
CPC .......... *H01L 23/5389* (2013.01); *H01L 21/561* (2013.01); *H01L 21/565* (2013.01); *H01L 21/568* (2013.01); *H01L 21/6835* (2013.01); *H01L 23/3128* (2013.01); *H01L 23/49827* (2013.01); *H01L 24/19* (2013.01); *H01L 24/20* (2013.01); *H01L 24/27* (2013.01); *H01L 24/96* (2013.01); *H01L 24/97* (2013.01); *H01L 25/03* (2013.01); *H01L 25/105* (2013.01); *H01L 23/49816* (2013.01); *H01L 24/48* (2013.01); *H01L 24/73* (2013.01); *H01L 2221/68331* (2013.01); *H01L 2221/68372* (2013.01); *H01L 2224/0401* (2013.01); *H01L 2224/04105* (2013.01); *H01L 2224/12105* (2013.01); *H01L 2224/16225* (2013.01); *H01L 2224/16235* (2013.01); *H01L 2224/20* (2013.01); *H01L 2224/274* (2013.01);

(Continued)

(58) Field of Classification Search
CPC ................. H01L 2924/00; H01L 2224/48227;
H01L 2924/15311; H01L 2224/32225; H01L
2224/73265; H01L 2224/97; H01L
2924/00014; H01L 2924/181; H01L 21/565;
H01L 2224/12105; H01L 2225/0651; H01L
2225/06541; H01L 23/49827; H01L 24/19;
H01L 24/27
USPC .......... 438/106, 109, 110, 121, 459; 257/686,
257/E21.599, E21.499, E23.141
See application file for complete search history.

(56) References Cited

U.S. PATENT DOCUMENTS 5,250,843 A 10/1993 Eichelberger
5,353,498 A 10/1994 Fillion et al.
(Continued)

*Primary Examiner* — Duy T Nguyen
(74) *Attorney, Agent, or Firm* — Robert D. Atkins; Patent Law Group: Atkins and Associates, P.C.

(57) ABSTRACT

A semiconductor wafer contains a plurality of semiconductor die. A plurality of bumps is formed on the semiconductor wafer. The bumps are electrically connected to contact pads on an active surface of the die. The bumps can also be pillars or stud bumps. A first encapsulant is deposited over the bumps. The semiconductor wafer is singulated to separate the die by cutting channels partially through the wafer and back grinding the wafer down to the channels. A second encapsulant is deposited over the die. A first interconnect structure is formed over a first surface of the second encapsulant. The first interconnect structure is electrically connected to the bumps. A second interconnect structure is formed over a second surface of the second encapsulant. Secondary semiconductor components can be stacked over the second interconnect structure. A third encapsulant is deposited over the stacked secondary components and second interconnect structure.

17 Claims, 7 Drawing Sheets

(51) Int. Cl.
*H01L 21/56* (2006.01)
*H01L 21/683* (2006.01)
*H01L 23/31* (2006.01)
*H01L 23/00* (2006.01)
*H01L 25/10* (2006.01)
*H01L 25/03* (2006.01)
*H01L 23/498* (2006.01)

(52) U.S. Cl.
CPC ........ *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/97* (2013.01); *H01L 2225/0651* (2013.01); *H01L 2225/06524* (2013.01); *H01L 2225/06541* (2013.01); *H01L 2225/06582* (2013.01); *H01L 2225/1035* (2013.01); *H01L 2225/1058* (2013.01); *H01L 2924/01004* (2013.01); *H01L 2924/014* (2013.01); *H01L 2924/01013* (2013.01); *H01L 2924/01029* (2013.01); *H01L 2924/01047* (2013.01); *H01L 2924/01049* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/09701* (2013.01); *H01L 2924/12041* (2013.01); *H01L 2924/1306* (2013.01); *H01L 2924/13091* (2013.01); *H01L 2924/14* (2013.01); *H01L 2924/1433* (2013.01); *H01L 2924/15174* (2013.01); *H01L 2924/15311* (2013.01); *H01L 2924/181* (2013.01); *H01L 2924/19041* (2013.01); *H01L 2924/30105* (2013.01)

(56) References Cited

U.S. PATENT DOCUMENTS

| | | | |
|---|---|---|---|
| 5,841,193 A | 11/1998 | Eichelberger | |
| 6,271,469 B1 | 8/2001 | Ma et al. | |
| 7,189,596 B1 | 3/2007 | Mu et al. | |
| 7,619,901 B2 | 11/2009 | Eichelberger et al. | |
| 8,039,303 B2 | 10/2011 | Shim et al. | |
| 2002/0056927 A1* | 5/2002 | Ohuchi et al. | 257/787 |
| 2004/0178495 A1* | 9/2004 | Yean | H01L 23/5389 257/723 |
| 2007/0108580 A1* | 5/2007 | Goller | 257/686 |
| 2007/0111398 A1* | 5/2007 | Hsu | 438/125 |
| 2007/0152318 A1 | 7/2007 | Chiang et al. | |
| 2007/0158861 A1 | 7/2007 | Huang et al. | |
| 2007/0222050 A1* | 9/2007 | Lee et al. | 257/678 |
| 2009/0008762 A1* | 1/2009 | Jung | 257/686 |
| 2009/0011545 A1 | 1/2009 | Chiang et al. | |
| 2009/0152715 A1 | 6/2009 | Shim et al. | |
| 2009/0224391 A1* | 9/2009 | Lin | H01L 21/6835 257/690 |

\* cited by examiner

SEMICONDUCTOR DEVICE AND METHOD OF FORMING PRE-MOLDED SEMICONDUCTOR DIE HAVING BUMPS EMBEDDED IN ENCAPSULANT

FIELD OF THE INVENTION

The present invention relates in general to semiconductor devices and, more particularly, to a semiconductor device and method of forming pre-molded semiconductor die having bumps embedded in an encapsulant.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In a fan-out wafer level chip scale package (FO-WLCSP) containing stacked semiconductor die, the vertical electrical interconnection can be accomplished with conductive through silicon vias (TSV), through hole vias (THV), or Cu-plated conductive pillars. The vertical interconnect is electrically connected to contact pads on the active surface of the stacked semiconductor die. The semiconductor die are susceptible to die chipping and cracking along the active surface of the die, particularly in the case of thin die. In addition, the die contact pads can become contaminated from residue from the die attach adhesive.

SUMMARY OF THE INVENTION

A need exists for thin semiconductor die which are robust against die chipping and cracking and die pad contamination. Accordingly, in one embodiment, the present invention is a method of making a semiconductor device comprising the steps of providing a semiconductor wafer containing a plurality of semiconductor die, and forming a plurality of bumps on the semiconductor wafer. The bumps are electrically connected to contacts pads on an active surface of the semiconductor die. The method further includes the steps of depositing a first encapsulant over the bumps, singulating the semiconductor wafer to separate the semiconductor die, depositing a second encapsulant over a surface of the semiconductor die opposite the bumps, and forming a first interconnect structure over a first surface of the second encapsulant. The first interconnect structure is electrically connected to the bumps.

In another embodiment, the present invention is a method of making a semiconductor device comprising the steps of providing a semiconductor wafer containing a plurality of first semiconductor components, forming a plurality of conductive links on the semiconductor wafer, depositing a first encapsulant over the conductive links, singulating the semiconductor wafer to separate the first semiconductor components, depositing a second encapsulant over a surface of the first semiconductor components opposite the conductive links, and forming a first interconnect structure over a first surface of the second encapsulant. The first interconnect structure is electrically connected to the conductive links.

In another embodiment, the present invention is a method of making a semiconductor device comprising the steps of providing a first semiconductor component, forming a plurality of conductive links on the first semiconductor component, depositing a first encapsulant over the conductive links, depositing a second encapsulant over a surface of the first semiconductor component opposite the conductive links, and forming a first interconnect structure over a first surface of the second encapsulant. The first interconnect structure is electrically connected to the conductive links.

In another embodiment, the present invention is a semiconductor device comprising a first semiconductor component and plurality of conductive links formed on the first semiconductor component. A first encapsulant is deposited over the conductive links. A second encapsulant is deposited over a surface of the first semiconductor component opposite the conductive links. A first interconnect structure is formed over a first surface of the second encapsulant. The first interconnect structure is electrically connected to the conductive links.

DETAILED DESCRIPTION OF THE DRAWINGS

Figure 1:
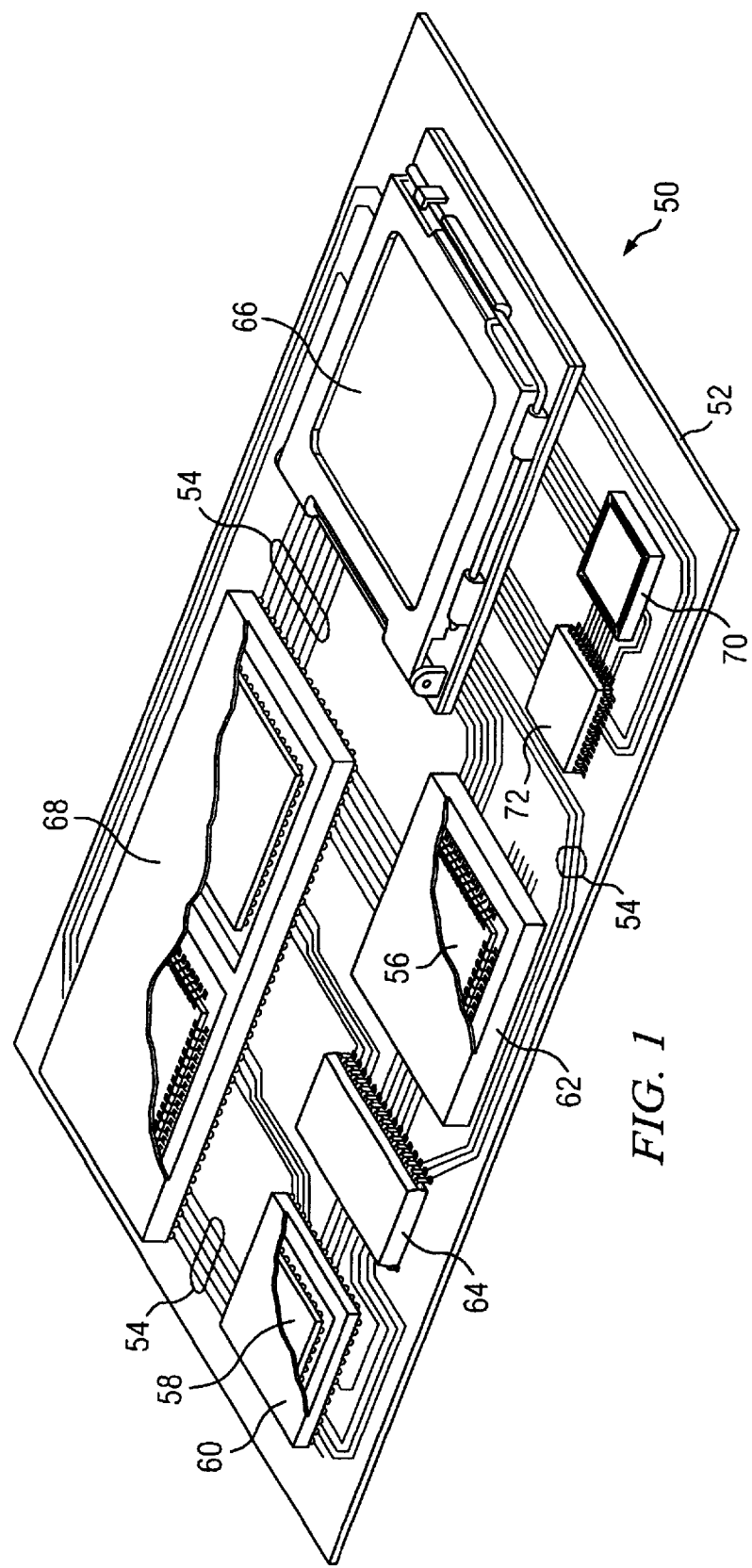
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
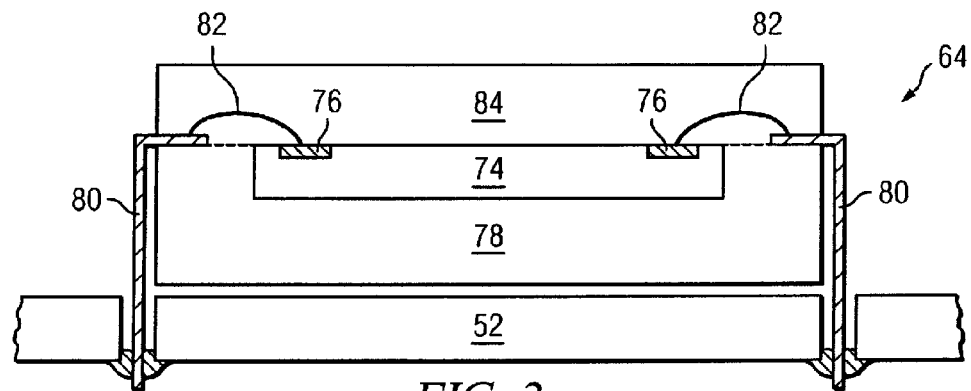
FIGS. 2a-2c illustrate further detail of the representative semiconductor packages mounted to the PCB.
Figure 2B:
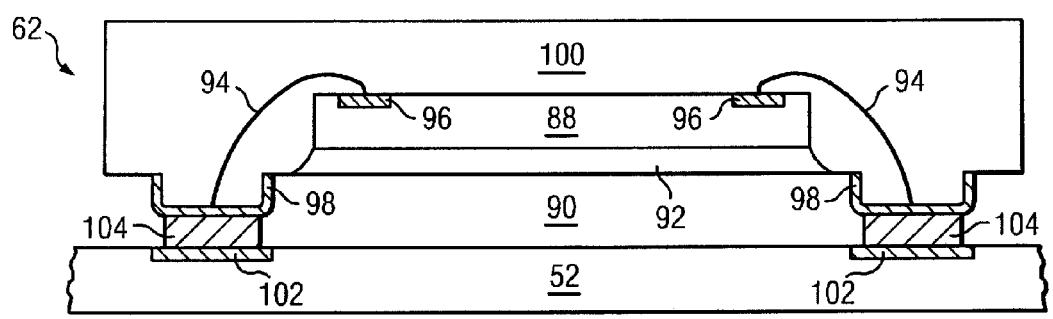
Figure 2C:
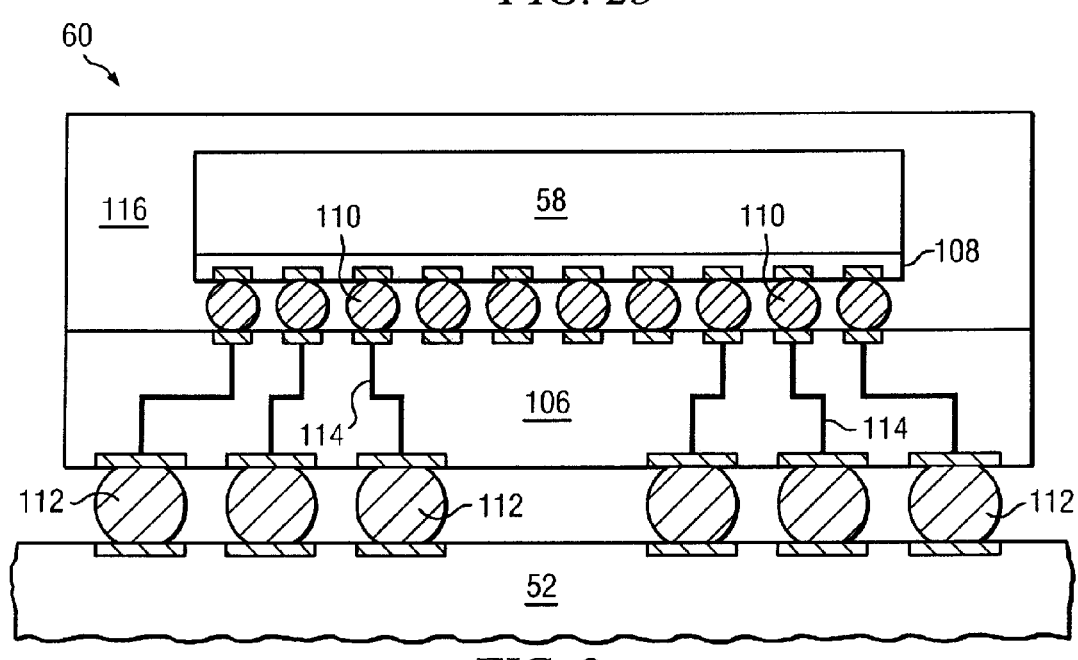

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
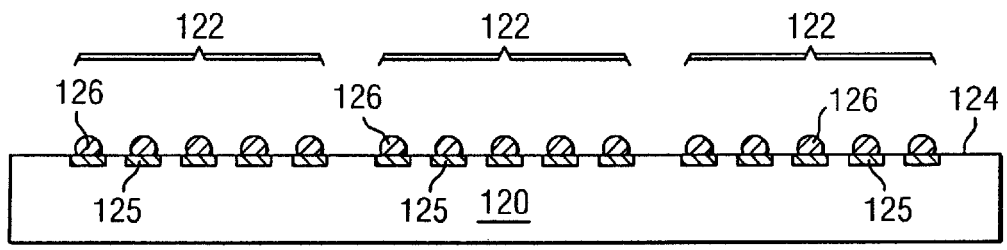
FIGS. 3a-3i illustrate a process of forming a pre-molded semiconductor die having bumps embedded in an encapsulant.

FIGS. 3a-3i illustrate, in relation to FIGS. 1 and 2a-2c, a process of forming a pre-molded semiconductor die having bumps embedded in an encapsulant within a FO-WLCSP. FIG. 3a shows a semiconductor wafer 120 with a base substrate material such as silicon, germanium, gallium arsenide, indium phosphide, or silicon carbide, for structural support. A plurality of semiconductor die or components 122 are formed on wafer 120 as described above. Each semiconductor die 122 includes an active surface 124 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 124 to implement analog circuits or digital circuits, such as digital signal processor (DSP), ASIC, memory, or other signal processing circuit. Semiconductor die 122 may also contain IPD, such as inductors, capacitors, and resistors, for RF signal processing. A typical RF system requires multiple IPDs in one or more semiconductor packages to perform the necessary electrical functions.

An electrically conductive bump material is deposited over contact pads 125 on active surface 124 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is reflowed by heating the material above its melting point to form spherical balls or bumps 126. Bumps 126 represent one type of interconnect structure that can be formed over contact pads 125 on active surface 124. The interconnect structure can also use stud bump, micro bump, conductive column, or other electrical interconnect links.

Figure 3B:
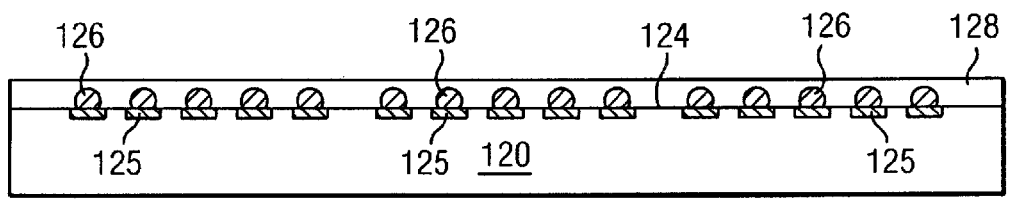

In FIG. 3b, an encapsulant or molding compound 128 is deposited over active surface 124 and bumps 126 using a paste printing, compressive molding, transfer molding, liquid encapsulant molding, vacuum lamination, spin coating, film lamination, or other suitable applicator. Encapsulant 128 can be polymer composite material, such as epoxy resin with filler, epoxy acrylate with filler, or polymer with proper filler.

Figure 3C:
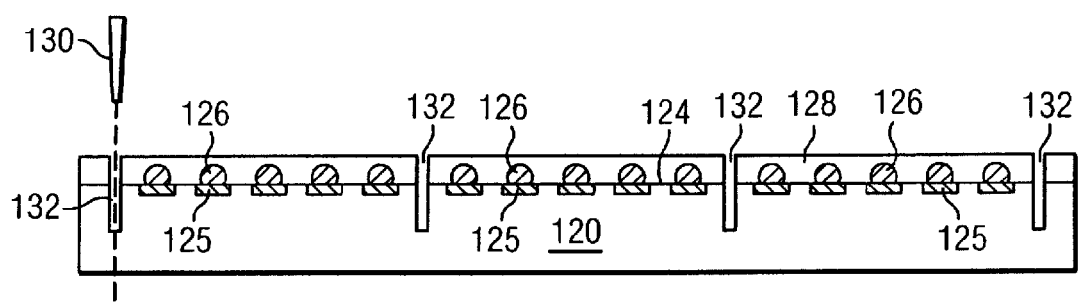
Figure 3D:
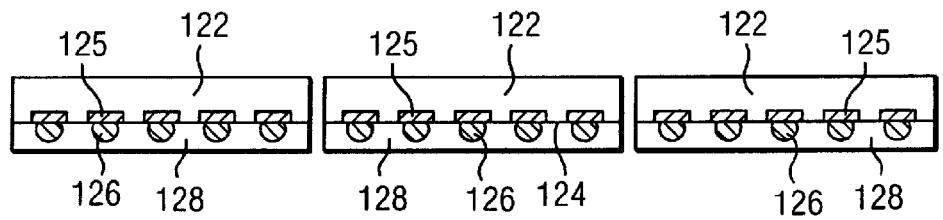

In FIG. 3c, semiconductor wafer 120 undergoes a dicing operation using saw blade or laser cutting tool 130 to cut channels 132 between semiconductor die 122. Channels 132 extend partially but not completely through semiconductor wafer 120. In one embodiment, channels 132 are cut past the desired final thickness of semiconductor die 122. A portion of the backside of semiconductor 120 is removed in a grinding operation to achieve the desired thickness of semiconductor die 122, which depends on the end application. The grinding operation removes bulk semiconductor material from the back side of semiconductor wafer 120 up to channels 132 to separate the wafer into individual semiconductor die 122, as shown in FIG. 3d.

In another embodiment, the backside of semiconductor wafer 120 undergoes backgrinding to remove excess bulk material and reduce the thickness of the die prior to singulation with saw blade or laser cutting tool 130.

Figure 3E:
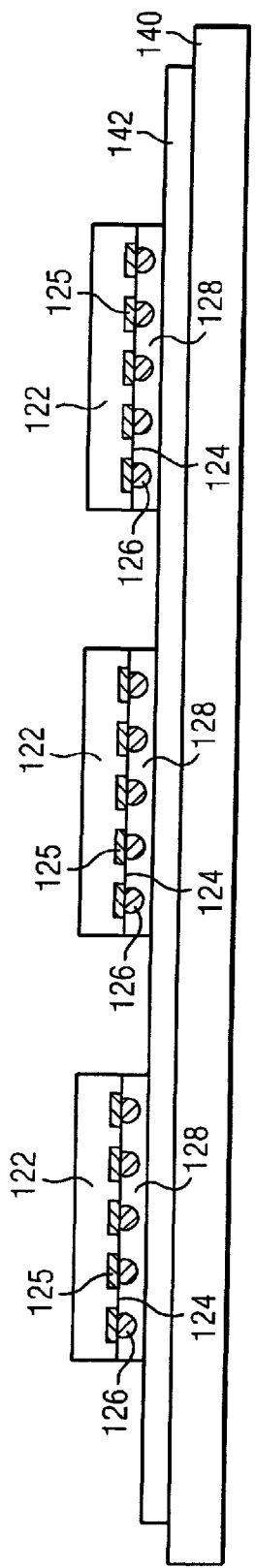

FIG. 3e shows a substrate or carrier 140 made with temporary or sacrificial base material such as silicon, polymer, polymer composite, metal, ceramic, glass, glass epoxy, beryllium oxide, or other suitable low-cost, rigid material or bulk semiconductor material for structural support. Carrier 140 can also be tape. An optional interface layer 142 is formed over carrier 140 as a temporary adhesive bonding film or etch-stop layer. The pre-molded semiconductor die 122 are mounted to interface layer 142 with encapsulant 128 oriented downward toward carrier 140.

Figure 3F:
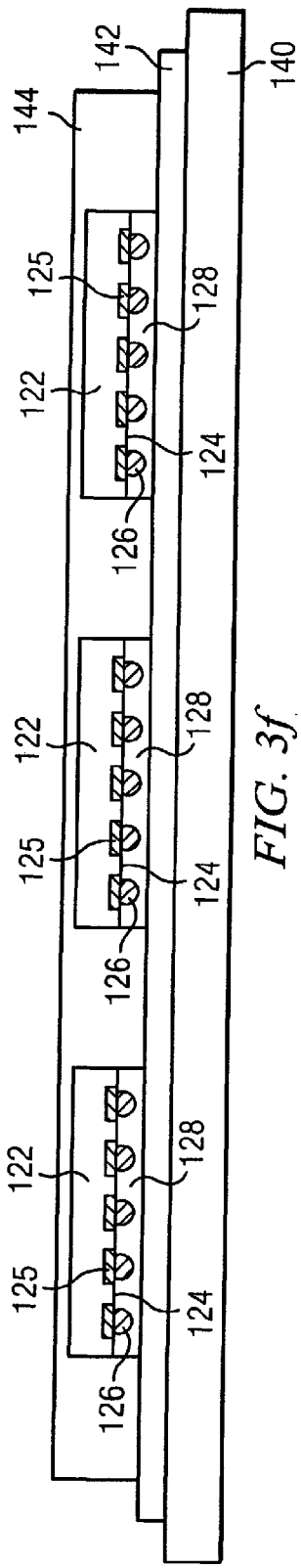

In FIG. 3f, an encapsulant or molding compound 144 is deposited over semiconductor die 122 and interface layer 142 using a paste printing, compressive molding, transfer molding, liquid encapsulant molding, spin coating, vacuum lamination, or other suitable applicator. In one embodiment, encapsulant 144 is deposited using a chase mold. Encapsulant 144 can be polymer composite material, such as epoxy resin with filler, epoxy acrylate with filler, or polymer with proper filler. Encapsulant 144 is non-conductive and environmentally protects the semiconductor device from external elements.

Figure 3G:
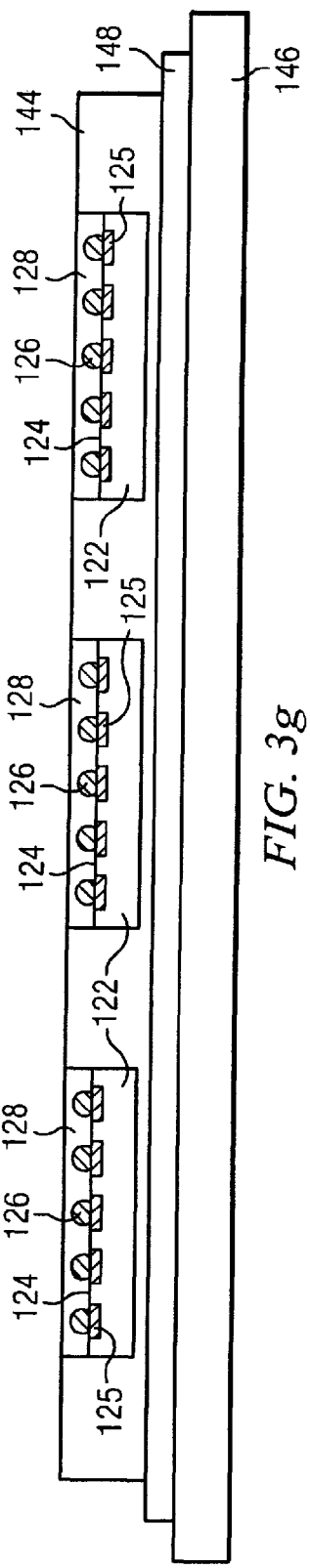

In FIG. 3g, the structure described in FIGS. 3a-3f is inverted and the surface of encapsulant 144 opposite carrier 140 is mounted to another temporary carrier 146 and optional interface layer 148. The temporary carrier 140 and optional interface layer 142 is then removed by chemical etching, mechanical peel-off, CMP, mechanical grinding, thermal bake, laser scanning, or wet stripping.

Figure 3H:
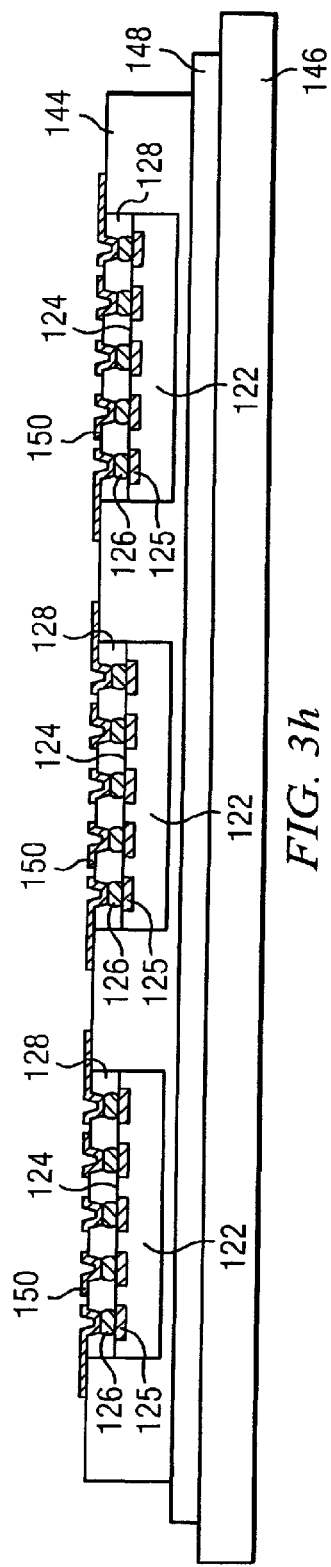

In FIG. 3h, a portion of encapsulant 128 over bumps 126 is removed by an etching process. An electrically conductive layer 150 is patterned and deposited over bumps 126 and encapsulant 128 using PVD, CVD, sputtering, electrolytic plating, electroless plating process, or other suitable metal deposition process. Conductive layer 150 can be one or more layers of Al, Cu, Sn, Ni, Au, Ag, or other suitable electrically conductive material. Conductive layer 150 is electrically connected to bumps 126.

Figure 3I:
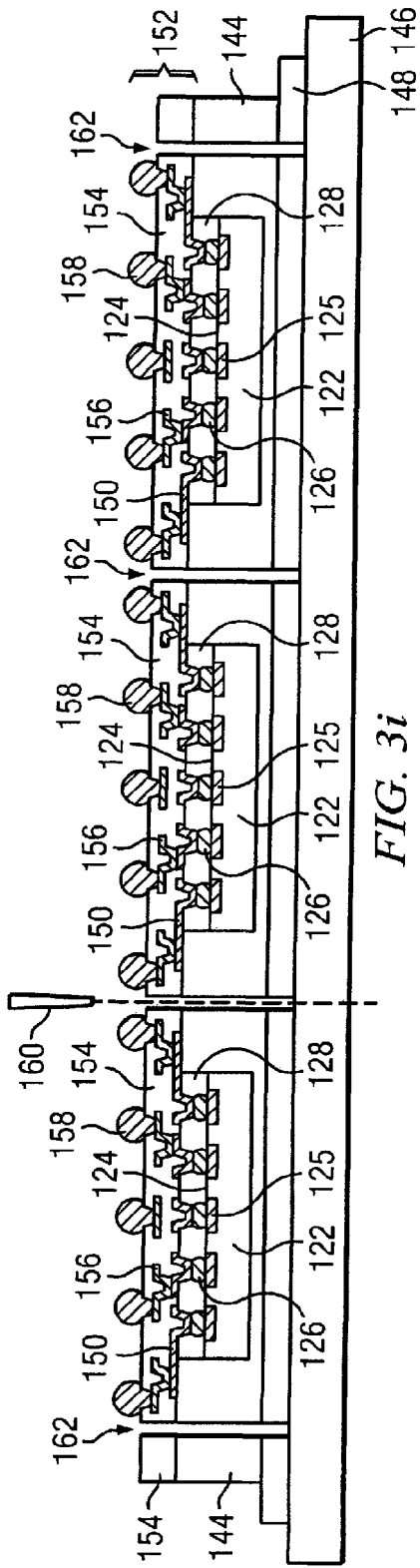

In FIG. 3i, a build-up interconnect structure 152 is formed over encapsulant 128 and 144 and conductive layer 150. The build-up interconnect structure 152 includes an insulating or passivation layer 154 containing one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 154 is formed using PVD, CVD, printing, spin coating, spray coating, sintering or thermal oxidation.

The build-up interconnect structure 152 further includes an electrically conductive layer 156 formed in insulating layer 154 using a patterning and deposition process such as PVD, CVD, sputtering, electrolytic plating, and electroless plating process. Conductive layer 156 can be one or more layers of Al, Cu, Sn, Ni, Au, Ag, or other suitable electrically conductive material. One portion of conductive layer 156 is electrically connected to conductive layer 150. Other portions of conductive layer 156 can be electrically common or electrically isolated depending on the design and function of the semiconductor device.

An electrically conductive bump material is deposited over build-up interconnect structure 152 and electrically connected to conductive layer 156 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 156 using a suitable attachment or bonding process. In one embodiment, the bump material is reflowed by heating the material above its melting point to form spherical balls or bumps 158. In some applications, bumps 158 are reflowed a second time to improve electrical contact to conductive layer 156. The bumps can also be compression bonded to conductive layer 156. Bumps 158 represent one type of interconnect structure that can be formed over conductive layer 156. The interconnect structure can also use bond wires, stud bump, micro bump, or other electrical interconnect.

The structure described in FIG. 3i undergoes a dicing operation using saw blade or laser cutting tool 160 to cut channels 162 between semiconductor die 122. The temporary carrier 140 and optional interface layer 142 are removed by chemical etching, mechanical peel-off, CMP, mechanical grinding, thermal bake, laser scanning, or wet stripping to singulate semiconductor die 122.

Figure 4:
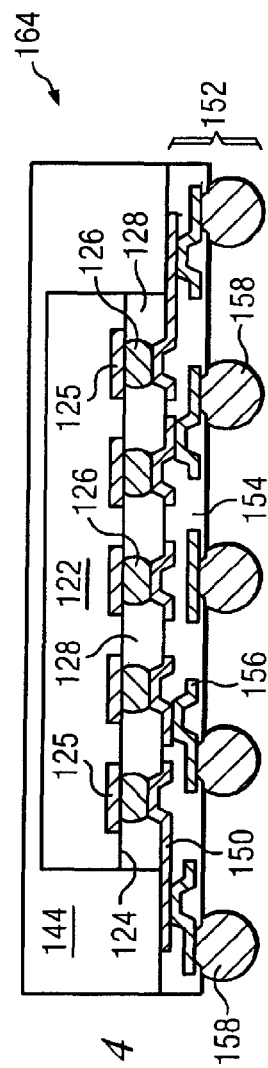
FIG. 4 illustrates the pre-molded semiconductor die having bumps embedded in the encapsulant.

FIG. 4 shows FO-WLCSP 164 after singulation. Bumps 126 are embedded in encapsulant 128 while in wafer form prior to build-up interconnect structure 152. The active and passive components on active surface 124 of semiconductor die 122 are electrically connected through embedded bumps 126 and conductive layers 150 and 156 to bumps 158. The pre-molded semiconductor die 122 having conductive bumps 126 embedded within encapsulant 128 provides stress relief and support to reduce die chipping and cracking along active surface 124 during consequent manufacturing processes & handling. The pre-molded die with embedded bumps is particularly useful in reducing die chipping and cracking for thin semiconductor die. With the additional support, a thinner semiconductor die 122 can be realized and handled without damage. The embedded conductive bumps also reduce contamination of the die contact pad 125 during consequent manufacturing process. The residue from die attach adhesive cannot contaminate the die contact pads because the pads are contained within encapsulant 128. The embedded bumps also act as a buffer layer to reduce sensitivity to variation in via formation process, such as laser source intensity variation.

Figure 5A:
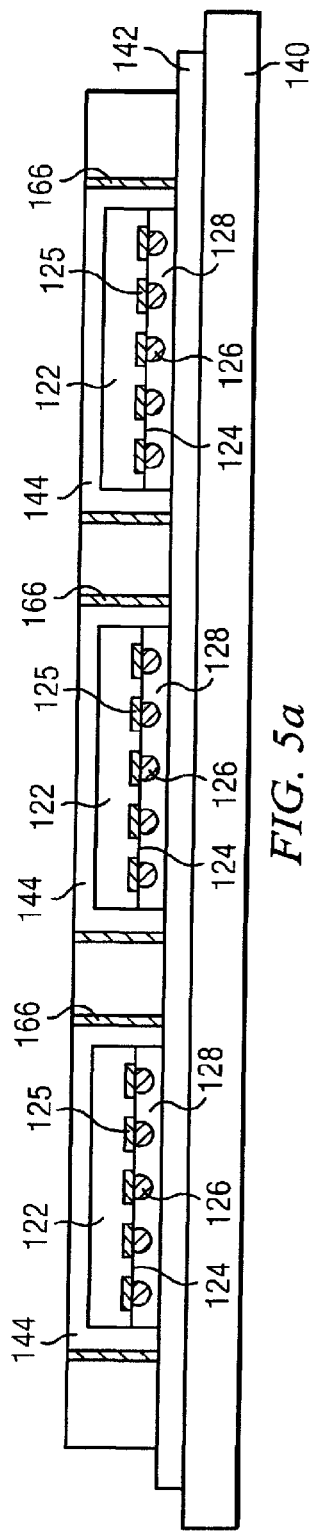
FIGS. 5a-5b illustrate the pre-molded semiconductor die with conductive pillars formed in the encapsulant.
Figure 5B:
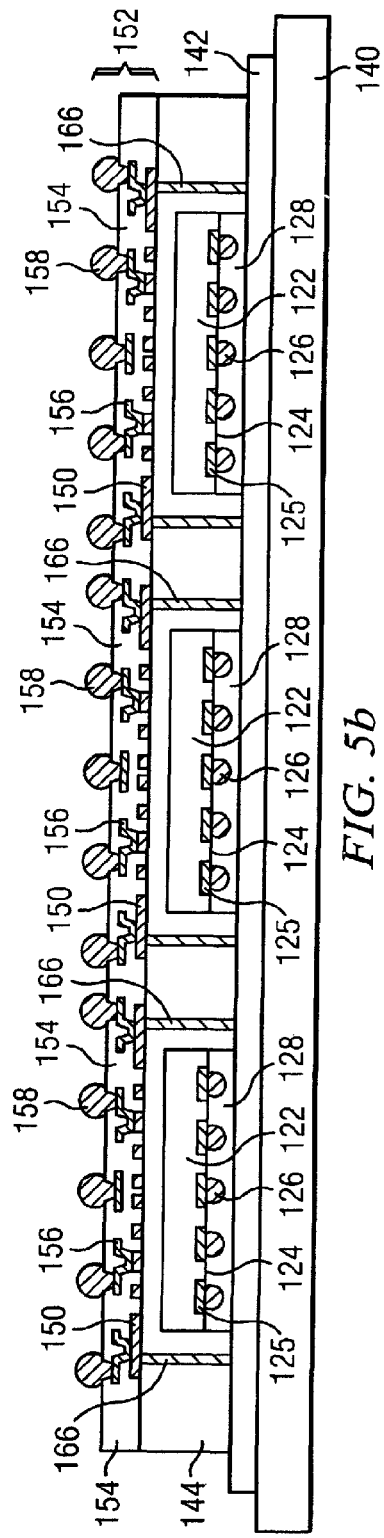

FIGS. 5a-5b show a variation to manufacturing process described in FIGS. 3a-3i. Prior to depositing encapsulant 144 in FIG. 3f, one or more layers of photoresist are deposited over interface layer 142. A portion of the photoresist is exposed and removed by an etch development process to form vias. Conductive material, such as Al, Cu, Sn, Ni, Au, Ag, titanium (Ti), tungsten (W), solder, poly-silicon, or combination thereof, is deposited in the vias using a selective plating process. The photoresist is stripped away leaving behind individual conductive pillars 166, as shown in FIG. 5b. Conductive pillars 166 are electrically connected to contact conductive layers 150 and 156. In another embodiment, conductive pillars 166 can be formed as stud bumps or stacked bumps.

Figure 6:
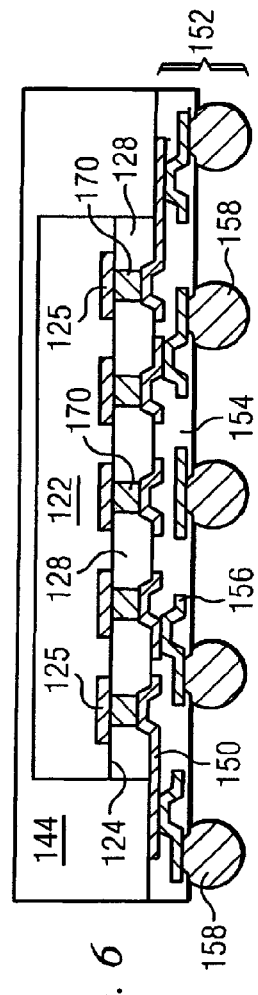
FIG. 6 illustrates the pre-molded semiconductor die with a conductive column embedded in the encapsulant.

FIG. 6 shows an embodiment with conductive column or pillars 170 embedded within encapsulant 128. Conductive column 170 is formed using a patterning and deposition process such as PVD, CVD, sputtering, electrolytic plating, and electroless plating process, similar to FIG. 3a. Conductive column 170 can be one or more layers of Al, Cu, Sn, Ni, Au, Ag, or other suitable electrically conductive material. Semiconductor die 122 is electrically connected through conductive column 170 to build-up interconnect structure 152 and bumps 158.

Figure 7:
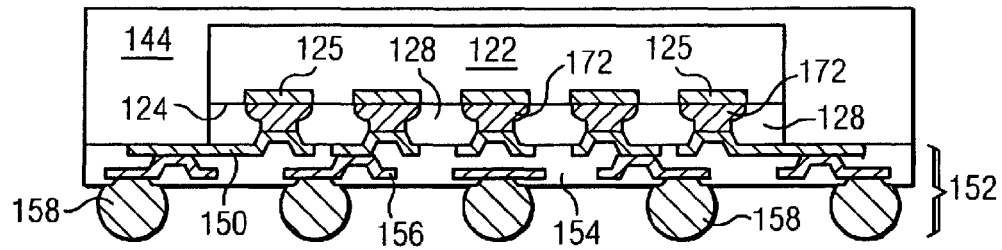
FIG. 7 illustrates the pre-molded semiconductor die with stud bumps embedded in the encapsulant.

FIG. 7 shows an embodiment with conductive stud bumps 172 embedded within encapsulant 128. Stud bump 172 is formed using a patterning and deposition process such as PVD, CVD, sputtering, electrolytic plating, and electroless plating process, similar to FIG. 3a. Stud bump 172 can be one or more layers of Al, Cu, Sn, Ni, Au, Ag, or other suitable electrically conductive material. Semiconductor die 122 is electrically connected through stud bump 172 to build-up interconnect structure 152 and bumps 158.

Figure 8:
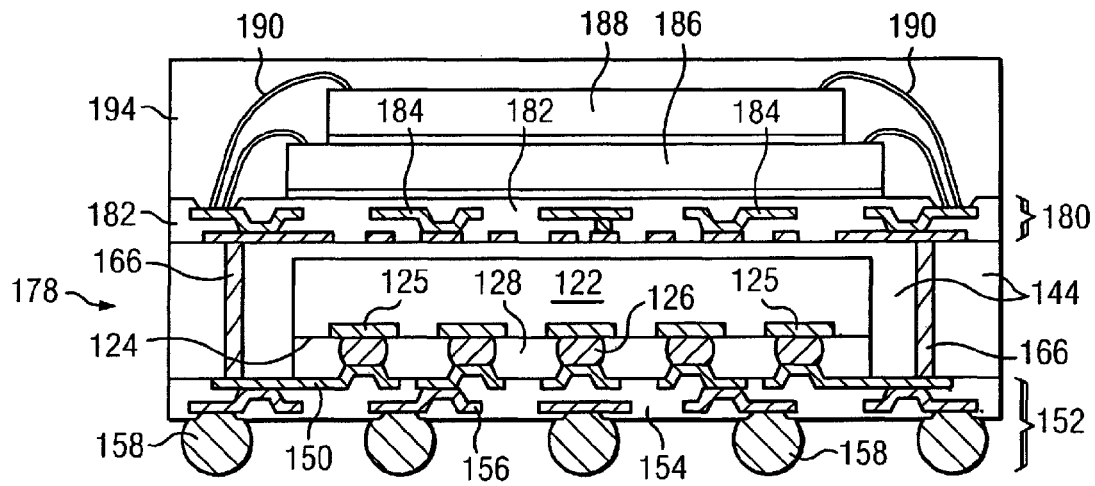
FIG. 8 illustrates the pre-molded semiconductor die with a topside build-up interconnect structure and secondary stacked semiconductor die.

FIG. 8 shows FO-WLCSP 178, similar to an embodiment of FIG. 5b, with a topside build-up interconnect structure 180 formed over a surface of encapsulant 144 opposite build-up interconnect structure 152. The build-up interconnect structure 180 includes an insulating or passivation layer 182 containing one or more layers of SiO2, Si3N4, SiON, Ta2O5, Al2O3, or other material having similar insulating and structural properties. The insulating layer 182 is formed using PVD, CVD, printing, spin coating, spray coating, sintering or thermal oxidation.

The build-up interconnect structure 180 further includes an electrically conductive layer 184 formed in insulating layer 182 using a patterning and deposition process such as PVD, CVD, sputtering, electrolytic plating, and electroless plating process. Conductive layer 184 can be one or more layers of Al, Cu, Sn, Ni, Au, Ag, or other suitable electrically conductive material. One portion of conductive layer 184 is electrically connected to conductive pillars 166. Other portions of conductive layer 184 can be electrically common or electrically isolated depending on the design and function of the semiconductor device.

Semiconductor die or component 186 is mounted to build-up interconnect structure 180 with die attach adhesive. Semiconductor die or component 188 is stacked over semiconductor die 186 using die attach adhesive. Semiconductor die 186 and 188 each include an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as DSP, ASIC, memory, or other signal processing circuit. Semiconductor die 186 and 188 may also contain IPD, such as inductors, capacitors, and resistors, for RF signal processing. A typical RF system requires multiple IPDs in one or more semiconductor packages to perform the necessary electrical functions.

Semiconductor die 186 and 188 are electrically connected to build-up interconnect structure 180 by bond wires 190. An encapsulant or molding compound 194 is deposited over semiconductor die 186 and 188 and build-up interconnect structure 180 using a paste printing, compressive molding, transfer molding, liquid encapsulant molding, spin coating, vacuum lamination, or other suitable applicator. In one embodiment, encapsulant 194 is deposited using a chase mold. Encapsulant 194 can be polymer composite material, such as epoxy resin with filler, epoxy acrylate with filler, or polymer with proper filler. Encapsulant 194 is non-conductive and environmentally protects the semiconductor device from external elements.

Figure 9:
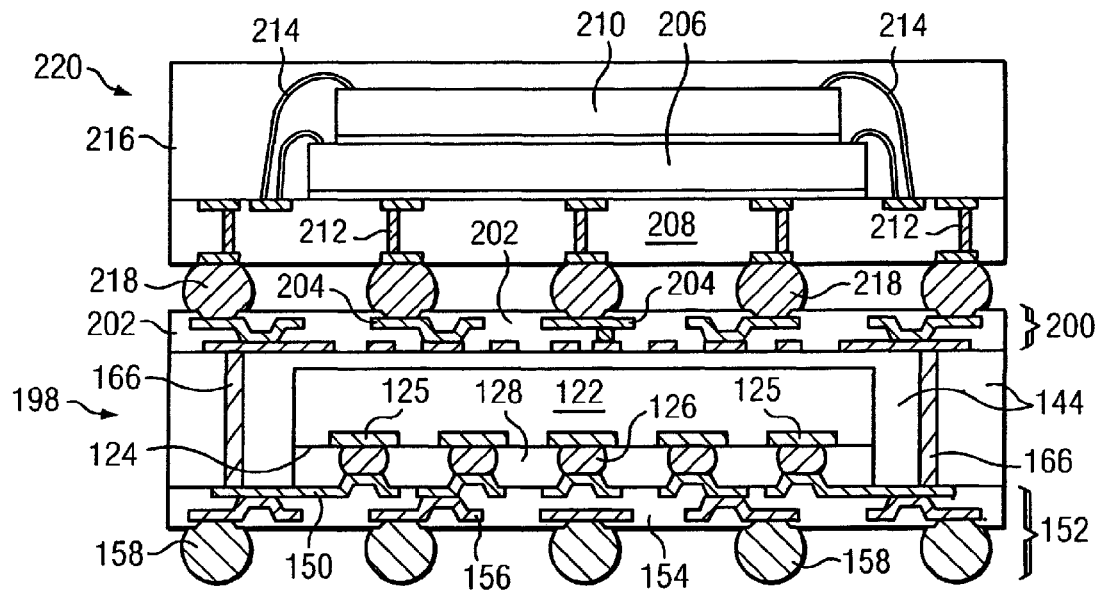
FIG. 9 illustrates the pre-molded semiconductor die with a topside build-up interconnect structure and secondary stacked semiconductor package.

FIG. 9 shows FO-WLCSP 198, similar to an embodiment of FIG. 5b, with a topside build-up interconnect structure 200 formed over a surface of encapsulant 144 opposite build-up interconnect structure 152. The build-up interconnect structure 200 includes an insulating or passivation layer 202 containing one or more layers of SiO2, Si3N4, SiON, Ta2O5, Al2O3, or other material having similar insulating and structural properties. The insulating layer 202 is formed using PVD, CVD, printing, spin coating, spray coating, sintering or thermal oxidation.

The build-up interconnect structure 200 further includes an electrically conductive layer 204 formed in insulating layer 202 using a patterning and deposition process such as PVD, CVD, sputtering, electrolytic plating, and electroless plating process. Conductive layer 204 can be one or more layers of Al, Cu, Sn, Ni, Au, Ag, or other suitable electrically conductive material. One portion of conductive layer 204 is electrically connected to conductive pillars 166. Other portions of conductive layer 204 can be electrically common or electrically isolated depending on the design and function of the semiconductor device.

Semiconductor die or component 206 is mounted to substrate 208 with die attach adhesive. Semiconductor die or component 210 is stacked over semiconductor die 206 using die attach adhesive. Semiconductor die 206 and 210 each include an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as DSP, ASIC, memory, or other signal processing circuit. Semiconductor die 206 and 210 may also contain IPD, such as inductors, capacitors, and resistors, for RF signal processing. A typical RF system requires multiple IPDs in one or more semiconductor packages to perform the necessary electrical functions.

Semiconductor die 186 and 188 are electrically connected to conductive layer 212 in substrate 208 by bond wires 214. An encapsulant or molding compound 216 is deposited over semiconductor die 206 and 210 and substrate 208 using a paste printing, compressive molding, transfer molding, liquid encapsulant molding, spin coating, vacuum lamination, or other suitable applicator. In one embodiment, encapsulant 216 is deposited using a chase mold. Encapsulant 216 can be polymer composite material, such as epoxy resin with filler, epoxy acrylate with filler, or polymer with proper filler.

Encapsulant 216 is non-conductive and environmentally protects the semiconductor device from external elements. The semiconductor package 220 with semiconductor die 206 and 210 stacked over substrate 208 is electrically connected to build-up interconnect structure 200 with bumps 218.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor wafer containing a plurality of semiconductor die;
    forming a plurality of bumps on contact pads distributed across an entire surface of the semiconductor die;
    depositing a first encapsulant over the semiconductor wafer to embed all of the bumps distributed across the entire surface of the semiconductor die with the first encapsulant contacting a surface of all of the bumps opposite the contact pads;
    singulating the semiconductor wafer to separate the semiconductor die while all of the bumps distributed across the entire surface of the semiconductor die remain embedded in the first encapsulant;
    depositing a second encapsulant over a side surface of the semiconductor die and further over a side surface of the first encapsulant and further over a surface of the semiconductor die opposite the bumps;
    removing a portion of the first encapsulant to form a plurality of openings over all of the bumps distributed across the entire surface of the semiconductor die after depositing the second encapsulant;
    forming a first interconnect structure contacting a first surface of the second encapsulant and the surface of the first encapsulant, wherein the interconnect structure includes a conductive layer conformally applied over the first encapsulant and into the openings to contact all of the bumps distributed across the entire surface of the semiconductor die;
    forming a plurality of conductive pillars through the second encapsulant; and
    forming a second interconnect structure over a second surface of the second encapsulant opposite the first surface of the second encapsulant.

2. The method of claim 1, further including:
    mounting the semiconductor die to a first temporary carrier after singulation from the semiconductor wafer;
    forming the second encapsulant over the semiconductor die and first temporary carrier;
    mounting the semiconductor die covered by the second encapsulant to a second temporary carrier;
    removing the first temporary carrier;
    forming the first interconnect structure over the first surface of the second encapsulant; and
    removing the second temporary carrier.

3. The method of claim 1, wherein singulating the semiconductor wafer includes:
    cutting channels partially through the semiconductor wafer; and
    back grinding the semiconductor wafer down to the channels to separate the semiconductor die.

4. The method of claim 1, further including:
    stacking a plurality of semiconductor components over the second interconnect structure with the semiconductor components electrically connected to the second interconnect structure; and
    depositing a third encapsulant over the semiconductor components and second interconnect structure.

5. The method of claim 1, further including:
    stacking a plurality of semiconductor components over a substrate;
    depositing a third encapsulant over the semiconductor components and substrate; and
    disposing the substrate over the second interconnect structure with the semiconductor components electrically connected to the second interconnect structure.

6. A method of making a semiconductor device, comprising:
    providing a semiconductor wafer including a plurality of first semiconductor components;
    forming a plurality of bumps distributed across a central region of each of the first semiconductor components;
    depositing a first encapsulant over the semiconductor wafer to embed the bumps distributed across the central region of the first semiconductor components with the first encapsulant contacting a surface of the bumps opposite the first semiconductor components;
    singulating the semiconductor wafer to separate the first semiconductor components while the first encapsulant completely covers the bumps distributed across the central region of the first semiconductor components;
    depositing a second encapsulant over a side surface of the first semiconductor components and further over a side surface of the first encapsulant and further over a surface of the first semiconductor components opposite the bumps;
    forming a plurality of openings in the first encapsulant and extending to the bumps distributed across the central region of the first semiconductor components after depositing the second encapsulant; and
    forming a first interconnect structure over a first surface of the second encapsulant and the surface of the first encapsulant, wherein the interconnect structure includes a conductive layer conformally applied over the first encapsulant and into the openings to contact the bumps distributed across the central region of the first semiconductor components.

7. The method of claim 6, further including forming a plurality of conductive pillars adjacent to the first semiconductor components.

8. The method of claim 6, wherein singulating the semiconductor wafer includes:
    cutting channels partially through the semiconductor wafer; and
    back grinding the semiconductor wafer down to the channels to separate the first semiconductor components.

9. The method of claim 6, further including forming a second interconnect structure over a second surface of the second encapsulant opposite the first surface of the second encapsulant.

10. The method of claim 9, further including:
    disposing a second semiconductor component over the second interconnect structure; and
    depositing a third encapsulant over the second semiconductor component and second interconnect structure.

11. The method of claim 9, further including:
    disposing a second semiconductor component over a substrate;

depositing a third encapsulant over the second semiconductor component and substrate; and disposing the substrate over the second interconnect structure.

12. A method of making a semiconductor device, comprising:

providing a first semiconductor component;

forming a plurality of conductive links distributed over a central region of the first semiconductor component;

depositing a first encapsulant over the first semiconductor component to embed the conductive links distributed over the central region of the first semiconductor component with the first encapsulant contacting a surface of the conductive links opposite the first semiconductor component;

depositing a second encapsulant over a side surface of the first semiconductor component and further over a side surface of the first encapsulant and further over a surface of the first semiconductor component opposite the conductive links while the surface of each of the conductive links remains embedded in the first encapsulant;

forming a plurality of openings in the first encapsulant and extending to the conductive links distributed over the central region of the first semiconductor component; and forming a conductive layer conformally over a first surface of the second encapsulant and into an opening in the first encapsulant extending to contact the conductive links distributed over the central region of the first semiconductor component.

13. The method of claim 12, wherein the conductive links are selected from the group consisting of bumps, pillars, and stud bumps.

14. The method of claim 12, further including forming a plurality of conductive pillars adjacent to the first semiconductor component.

15. The method of claim 12, further including forming an interconnect structure over a second surface of the second encapsulant opposite the first surface of the second encapsulant.

16. The method of claim 15, further including:

disposing a second semiconductor component over the interconnect structure; and depositing a third encapsulant over the second semiconductor component and interconnect structure.

17. The method of claim 15, further including:

disposing a second semiconductor component over a substrate; and disposing the substrate over the interconnect structure.

* * * * *